(12) United States Patent
Mandelman et al.

(10) Patent No.: US 6,580,136 B2
(45) Date of Patent: Jun. 17, 2003

(54) METHOD FOR DELINEATION OF EDRAM SUPPORT DEVICE NOTCHED GATE

(75) Inventors: Jack A. Mandelman, Stormville, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/772,345

(22) Filed: Jan. 30, 2001

(65) Prior Publication Data

US 2002/0100945 A1 Aug. 1, 2002

(51) Int. Cl.[7] .......................... H01L 29/76; H01L 29/94; H01L 31/62; H01L 31/113; H01L 31/119; H01L 27/108

(52) U.S. Cl. ........................................ 257/401; 257/296

(58) Field of Search ................................ 257/295–310, 257/382–412; 438/253–254, 396–398, 300–305

(56) References Cited

U.S. PATENT DOCUMENTS

| | | | | | |
|---|---|---|---|---|---|
| 5,559,049 | A | * | 9/1996 | Cho | 438/300 |
| 6,074,908 | A | * | 6/2000 | Huang | 438/253 |
| 6,184,079 | B1 | * | 2/2001 | Lee | 438/253 |
| 6,277,694 | B1 | * | 8/2001 | Wu | 438/253 |

OTHER PUBLICATIONS

Ghani, T., et al., "100 nm Gate Length High Performance/Low Power CMOS Transistor Structure", 1999 IEDM Technical Digest, pp. 415–418, Sep. 1999.

* cited by examiner

Primary Examiner—Cuong Quang Nguyen
(74) Attorney, Agent, or Firm—Scully, Scott, Murphy & Presser; H. Daniel Schnurmann

(57) ABSTRACT

A complementary metal oxide semiconductor integrated circuit containing a notched gate in the support device region as well as a method of forming the same are provided. The method of the present invention includes the steps of (a) forming a gate stack on a surface of a substrate, the gate stack including at least a gate dielectric having a gate conductor formed thereon and the substrate includes array device regions and support device regions; (b) protecting portions of the gate stack in the array and support device regions, while leaving other portions of the gate stack exposed; (c) partially etching the exposed portions of the gate stack so as to remove some, but not all, of the gate conductor; (d) forming a gapfill film on the protected gate stack and on the partially etched gate stack in the array and support device regions; (e) removing the gapfill film from the support device regions, while selectively removing the gapfill film from the array device regions so as to leave gapfill film between adjacent protected gate stacks; (f) forming spacers on any exposed sidewalls of the protected gate stacks; (g) removing exposed gate conductor in the array and support device regions; (h) providing an undercut in lower exposed regions of remaining gate conductor; and (i) removing remaining gapfill film from adjacent protected gate stacks in the array device region.

7 Claims, 5 Drawing Sheets

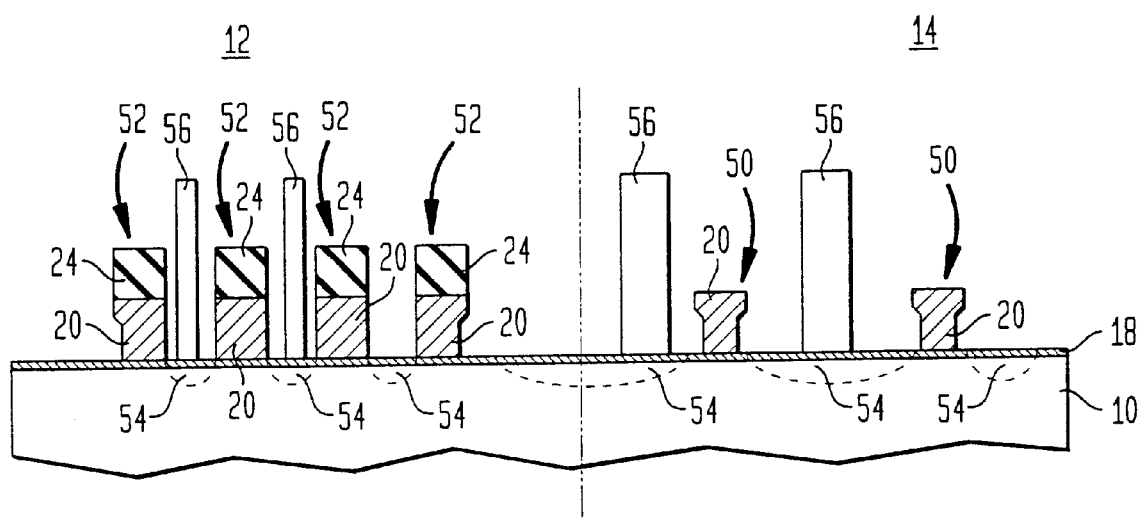

METHOD FOR DELINEATION OF EDRAM SUPPORT DEVICE NOTCHED GATE

FIELD OF THE INVENTION

The present invention relates to a method of fabricating complementary metal oxide semiconductor (CMOS) integrated circuits ICs), and more particularly to a method of fabricating CMOS ICs wherein increased performance is obtained in the support and logic device regions, without negatively impacting the array device region. Specifically, the present invention provides a method of fabricating a CMOS IC wherein the support gate is notched for high-performance without impacting the array device region. The prevent invention also provides CMOS ICs formed by the inventive method which include notched support gates and diffusion contacts that are borderless to the gate conductors.

BACKGROUND OF THE INVENTION

The accelerating rate of improvement in the performance of advanced generations of CMOS ICs has been enabled by the aggressive scaling of the minimum lithographic feature size and supply voltages as well as innovations in the transistor structure, and the addition of higher-levels of systems functionality of the IC design. The combination of on-chip embedded memory such as eDRAM (embedded dynamic random access memory) with advanced CMOS logic is one means of increasing IC functionality and hence improving the performance of advanced generation of CMOS ICs.

Insofar as innovations in transistor structure are concerned, several key features have been incorporated into conventional transistors that are responsible for improving the performance of the same. These key features include:

(a) insertion of a Notched-Poly process;

(b) implant and anneal optimization;

(c) thin physical gate dielectrics (on the order of about 2 nm or less); and (d) change from titanium silicide to cobalt silicide.

A detailed discussion concerning the above features and their importance in improving the performance of conventional transistors is found in T. Ghani, et al., "100 nm Gate Length High Performance/Low Power CMOS Transistor Structure", 1999 IEDM Technical Digest, pp.415–418. Despite disclosing MOSFETs with notched gates that enable shorter than lithographic channel lengths, the T. Ghani, et al. article is applicable to a logic process (i.e., it contains no insulating cap) and does not accommodate for the formation of borderless contacts to diffusion regions.

In view of the drawbacks in the prior art, there is a need for developing a method for fabricating a MOSFET with a notched gate in an eDRAM process employing diffusion contacts that are borderless to the gate conductor.

SUMMARY OF THE INVENTION

One object of the present invention is to form transistors, i.e., MOSFETs, in support regions having channels that are shorter than that which can be formed utilizing conventional lithography, and at the same time, selectively maintaining longer channels for certain devices in array regions such as the memory array of a DRAM device.

Another object of the present invention is to provide a method wherein increased performance can be achieved in both the support and logic regions of a CMOS IC, without impacting the memory array transistor.

A further object of the present invention is to provide a method of fabricating a CMOS IC having short channels in the support regions and longer channels in the array regions that utilizes simple, yet CMOS compatible processing steps.

These and other objects and advantages are achieved in the present invention by employing a method which includes at least the steps of: forming a notch profile at the bottom of the gate of the CMOS logic transistor to shorten the channel length; and depositing and etching back a gapfill film over the wafer which will overfill the tight-pitch array region and underfill the relaxed-pitch support CMOS region, thereby delineating the array and support regions of the wafer.

Specifically, the method of the present invention includes the following processing steps:

(a) forming a gate stack on a surface of a substrate, said gate stack comprising at least a gate dielectric having a gate conductor formed thereon and said substrate includes array device regions and support device regions;

(b) protecting portions of said gate stack in said array and support device regions, while leaving other portions of said gate stack exposed;

(c) partially etching said exposed portions of said gate stack so as to remove some, but not all, of said gate conductor;

(d) forming a gapfill film on said protected gate stack and on said partially etched gate stack in said array and support device regions;

(e) removing said gapfill film from said support device regions, while selectively removing said gapfill film from said array device regions so as to leave gapfill film between adjacent protected gate stacks;

(f) forming spacers on any exposed sidewalls of said protected gate stacks in said array and support device regions;

(g) removing exposed gate conductor in said array and support device regions;

(h) providing an undercut in lower exposed regions of said gate conductor of said protected gate stacks in said array and support device regions; and (i) removing remaining gapfill film from adjacent protected gate stacks in said array device region.

Following steps (a)–(i) above, conventional processing steps are used in completing the CMOS IC device which includes a notched gate in the support device region and contacts that are borderless to diffusion regions.

In addition to the above method, the present invention also relates to CMOS ICs that are formed therefrom. Specifically, the inventive CMOS ICs comprises:

a substrate having source and drain diffusion regions formed therein, and comprising array device regions and support device regions;

notched gates formed in said support device regions on portions of said substrate that do not include said source and drain diffusion regions; and gates formed in said array device regions on portions of said substrate that do not include said source and drain diffusion regions, wherein some of said source and drain diffusion regions in said support and array device regions contain borderless diffusion contacts.

BRIEF DESCRIPTION OF THE DRAWINGS

FIGS. 1–9 are pictorial representations of a CMOS IC structure through various processing steps of the present invention.

DETAILED DESCRIPTION OF THE INVENTION

Figure 1:
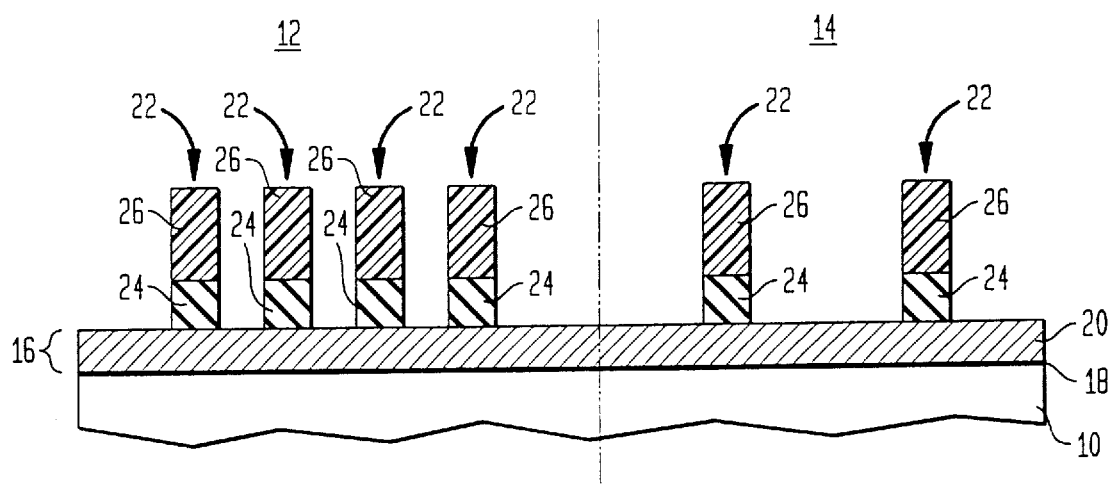

The present invention which provides a method of fabricating CMOS ICs wherein the support transistors have channel lengths that are shorter than that which can be formed utilizing conventional lithography, while maintaining longer channels for the array transistors, will now be described in greater detail by referring to the drawings that accompany the present application. It is noted that like and/or corresponding elements in the drawings are referred to by like reference numerals.

Reference is first made to FIG. 1 which shows an initial structure that is employed in the present invention after gate stack formation and patterning. Specifically, the structure shown in FIG. 1 comprises substrate 10 having gate stack 16 formed thereon. The gate stack includes gate dielectric 18 formed on a surface of substrate 10, and a gate conductor 20 formed on the gate dielectric. The structure shown in FIG. 1 also includes patterned regions 22 which include patterned antireflective coating or mask 24 and patterned resist 26. Patterned antireflective coating or mask 24 is employed in the present invention in protecting the underlying gate stack during subsequent etching processes. The structure shown in FIG. 1 is made of conventional materials that are well known in the art and conventional processes, as described hereinbelow, are employed in fabricating the same.

Substrate 10 employed in the present invention comprises any conventional semiconducting material including, but not limited to: Si, Ge, SiGe, InAs, GaAs, InP and other like III/V compound semiconductors. The present invention also includes layered substrates such as Si/Si or Si/SiGe as well as silicon-on-insulators (SOIs). The substrate employed in the present invention includes at least one array device region 12 and at least one support device region 14 therein. The array device regions are those regions of the substrate which have devices that benefit from longer channel lengths. Typically, the array device regions contain DRAM capacitors (and hence access transistors to the capacitors). These circuits tend to operate at higher-voltages than the support device regions. The support device regions, which generally benefit from devices having shorter channel lengths, generally (but not always) operate at lower-voltages and consist of higher-performance transistors than the devices of the array device regions. The support device regions contain circuitry exclusive of the memory array, such as drivers, decoders, charge pumps, and I/O devices. Although the drawings of the present invention depict the presence of only one of each device region therein, a plurality of such device regions together with logic device regions may be present in the substrate.

Gate stack 16 is formed on a surface of substrate 10 utilizing conventional processes well known in the art. For example, the gate dielectric of the gate stack may be formed by a conventional deposition process such as chemical vapor deposition (CVD), plasma-assisted CVD, sputtering, and chemical solution deposition, or alternatively, the gate dielectric is formed by a thermal growing process which may include oxidation, nitridation, or oxynitridation.

The gate dielectric, which may be composed of an oxide, nitride, oxynitride or combinations and multilayers thereof, is a thin layer whose thickness is on the order of about 5 nm or less. More preferably, the gate dielectric employed in the present invention has a thickness of from about 1 to about 3.5 nm.

The gate conductor is then formed on the gate dielectric also using a conventional deposition process well known in the art. For example, the gate conductor may be formed by CVD, plasma-assisted CVD, sputtering, plating, chemical solution deposition and other like deposition processes. The gate conductor may be composed of a single material such as polysilicon, or a conductive metal (e.g., W, Pt, Cu, and other like conductive metals), or, in some embodiments, multilayer gate conductors such as polysilicon and a silicide capping layer can be employed. When a multilayer gate conductor is employed, the multilayer gate conductor is formed by conventional deposition processes and a conventional silicide process is used in forming the silicide capping layer. It is noted that in the drawings of the present invention only a single gate conductor is shown. Despite this illustration, the present invention also works well for multilayer gate conductors.

The thickness of the gate conductor of the gate stack may vary and is not critical to the present invention. Typically, however, the gate conductor has a total thickness of from about 20 to about 300 nm, with a thickness of from about 30 to about 150 nm being more preferred.

After formation of gate stack 16 on the surface of substrate 10, a conventional mask, e.g., SiN, or antireflective coating (hereinafter referred to as insulating cap 24) is then formed on an exposed upper surface of gate conductor 20 utilizing a conventional deposition process well known to those skilled in the art. For example, insulating cap 24 may be formed by CVD, plasma-assisted CVD, sputtering, spin-on coating and other like deposition processes.

Next resist 26 is formed on insulating cap 24 utilizing conventional deposition processes well known in the art and conventional lithography (including resist exposure and development) and etching (including an anisotropic etching process such as reactive-ion etching (RIE), plasma etching and ion beam etching) are employed in forming patterned regions 22 on the surface of gate stack 16. A preferred etching process used in this step of the present invention is anisotropic RIE which includes fluorine-containing plasma. As shown, patterned regions 22 include patterned resist 26 and patterned insulating cap 24. The patterned insulating cap is used to protect some regions of the gate stack in both the array and support device regions, while leaving other portions of the gate stack, i.e., gate conductor, exposed. Following the formation of the patterned regions, the resist is removed from the structure utilizing conventional stripping processes well known to those skilled in the art.

Note patterned insulating cap 24 remains on the gate stack after removing the patterned resist and is used to protect the underlying gate stack from subsequent processing steps of the present invention. In one embodiment of the present invention which is not shown in the drawings, an oxide layer is formed between the insulating cap and the resist. This embodiment provides an extra insulating layer in the structure.

It is further noted that in the array device region the patterned, protective regions are spaced more closely together than in the support device region. This is because the array is built on a minimum pitch meaning minimum space and minimum line width (i.e., tight pitch), whereas the support has larger than minimum space between the gate conductors (i.e., relaxed pitch).

Figure 2:
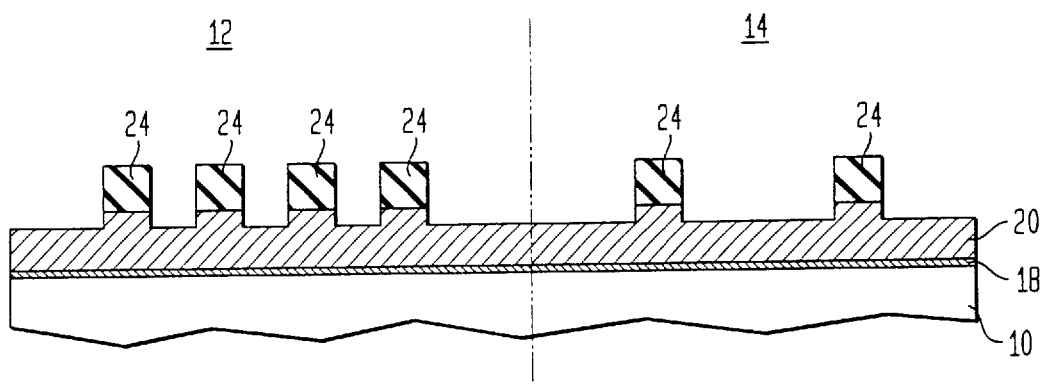

Next, as shown in FIG. 2, the exposed portions of the gate stack, not including the patterned insulating cap, are subjected to a partial etching process which removes some, but not all, of the unexposed gate conductor from the structure. This partial etching step, which is carried out in both the array device region and the support device region, includes any conventional anisotropic etching process which is selective to patterned insulating cap 24. In one embodiment of the present invention, the partial etching of the gate conductor is carried out by RIE using chlorine-containing plasma.

Figure 3:
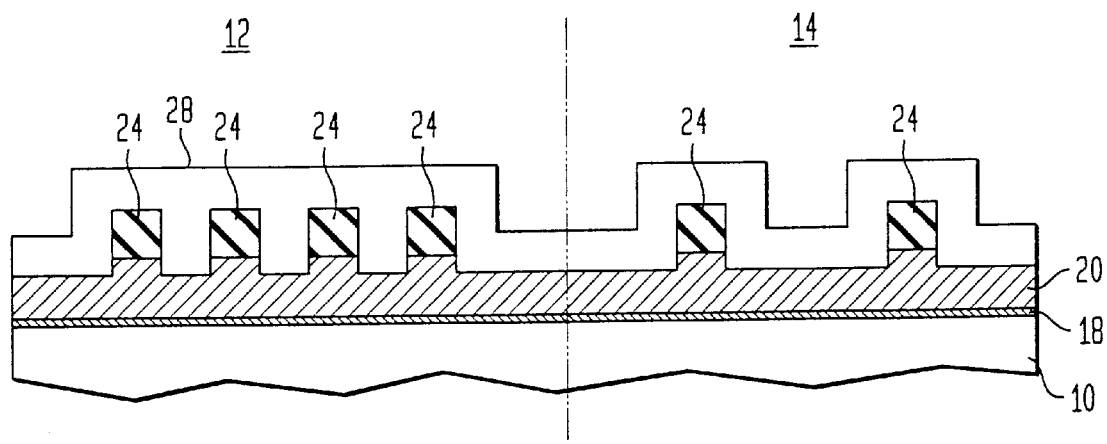

FIG. 3 shows the structure that is obtained after gapfill film 28 is formed on all exposed surfaces of the structure, including on the surfaces of the partially etched gate conductor and on the surface of the protective regions. In accordance with the present invention, gapfill film 28 is formed on the structure utilizing a conventional deposition process that is capable of forming a conformal layer of the gapfill film. Suitable deposition processes include, but are not limited to: CVD, plasma-assisted CVD and sputtering. The gapfill film employed in the present invention is composed an oxide such as boron doped silicon dioxide or other like material Although the thickness of the gapfill film may vary, it is preferred to deposit the film such that the thickness is greater that the ½ separation between the gate conductor pattern in the array device region, and less than ½ the minimum separation between the gate conductor pattern in the support device region.

Figure 4:
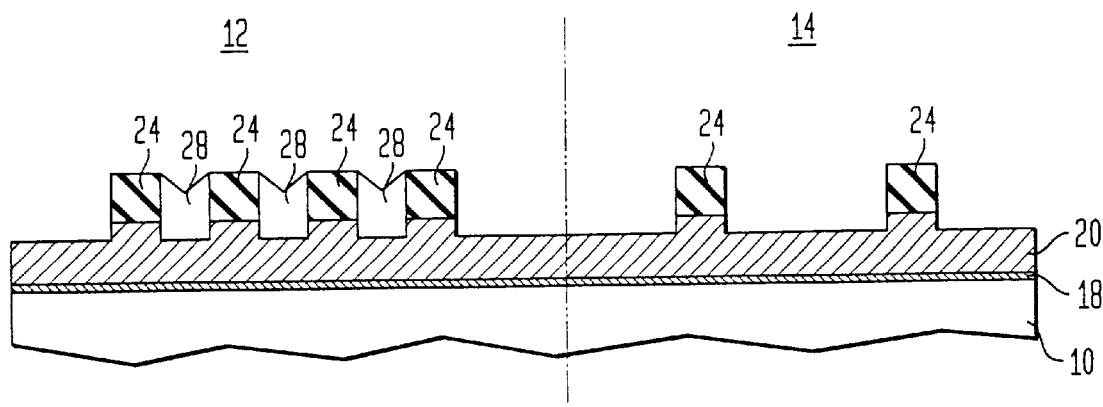

Next, the conformal gapfill film provided in FIG. 3 is partially removed from the structure such that gapfill film remains between adjacent protective gate stacks in the array device region, See FIG. 4. The structure illustrated by FIG. 4 is formed by utilizing a conventional isotropic etching process such as etching with an HF-containing solution. As shown in FIG. 4, gapfill film 28 remains between adjacent protective gate stacks in the array device region, but has been completely removed from all other areas of the structure. The isotropic removal process employed in the present invention is selective to the gate conductor and the patterned insulating cap.

Figure 5:
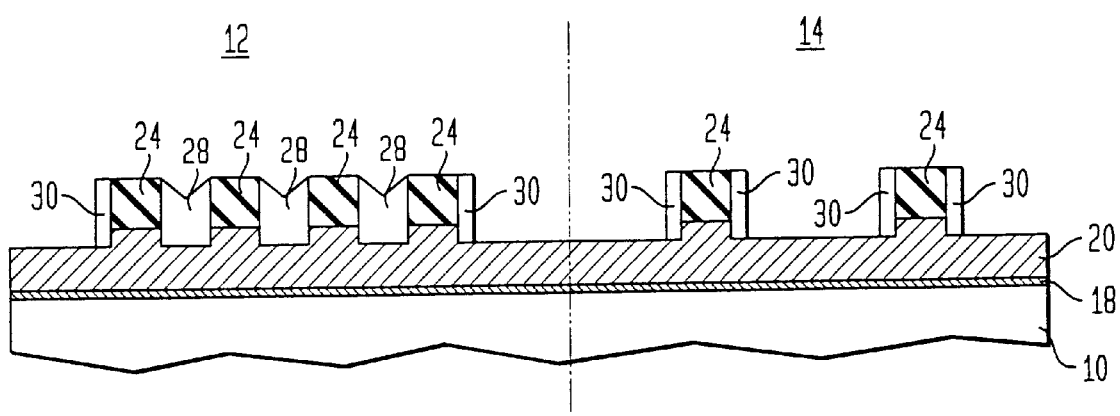

After selective removing the gapfill film from some portions of the structure, thin spacers 30 are formed on all exposed vertical sidewalls of the protective gate stacks in both the array device region and the support device region, See FIG. 5. Specifically, the spacers, which are formed of an insulator material such as a nitride, oxide or oxynitride, are formed utilizing a conventional deposition process, followed by etching. The etching step used in forming spacers 30 is typically carried out utilizing an anisotropic etching process that includes fluorine-containing plasma. It is noted that the spacers are present on sidewalls of the gate conductor in the support device region and at the boundaries of the adjacent gate conductors in the array device region. The thickness of the spacers employed in the present invention may vary and is not critical to the present invention, but typically, spacers 30 have a thickness of from about 2 to about 10 nm.

Figure 6:
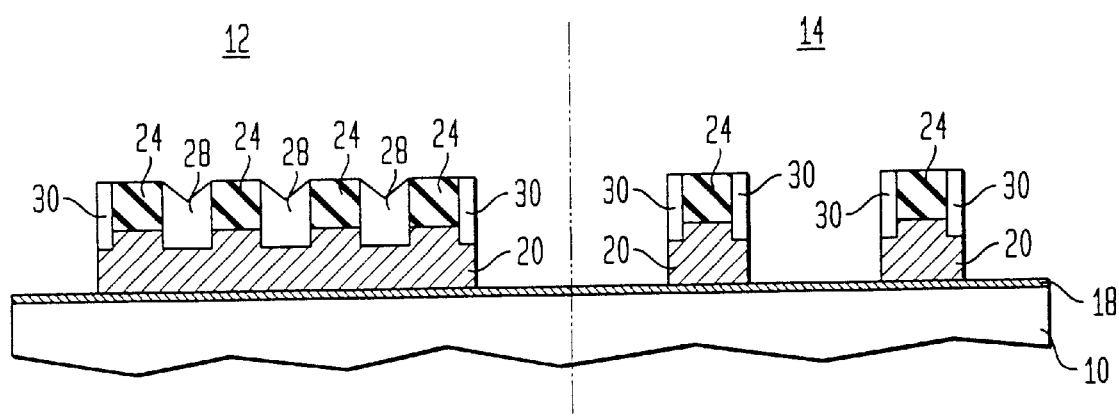

FIG. 6 shows the structure that is obtained after removing exposed gate conductor from both the array and support device regions. Specifically, the structure shown in FIG. 6 is obtained by utilizing a conventional anisotropic dry etching process which is capable of removing the gate conductor, while stopping on the gate dielectric. One highly-preferred anisotropic dry etching process employed in this step of the present invention is a chlorine-containing RIE process.

Figure 7:
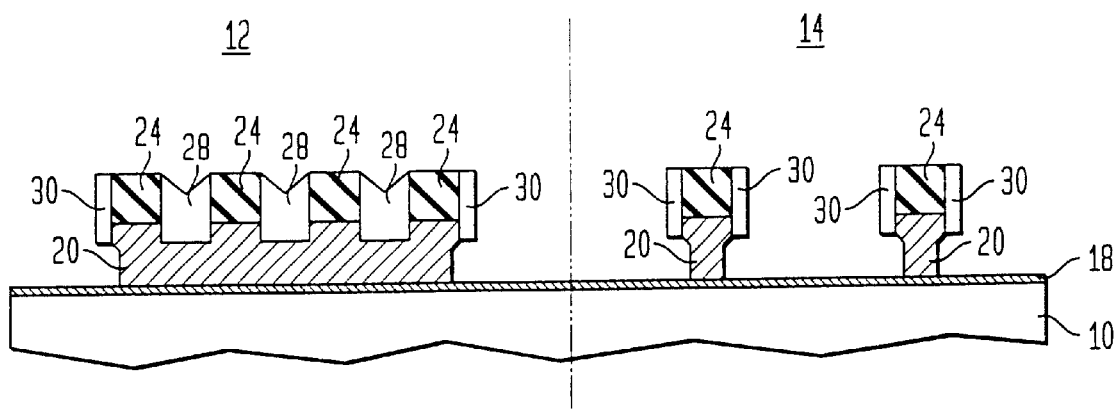

After removing the exposed portions of the gate conductor, an undercut is formed in the lower exposed portion of the gate conductor providing the notched structures in both the array and support device regions, See FIG. 7. Specifically, the undercut is formed in the protective gate stacks in both device regions by utilizing a conventional isotropic etching process such as chemical dry etching with a chlorine-containing mixture, or a wet chemical solution such as KOH. It is noted that the etching process employed in this step of the present invention is selective to the underlying gate dielectric.

Figure 8:
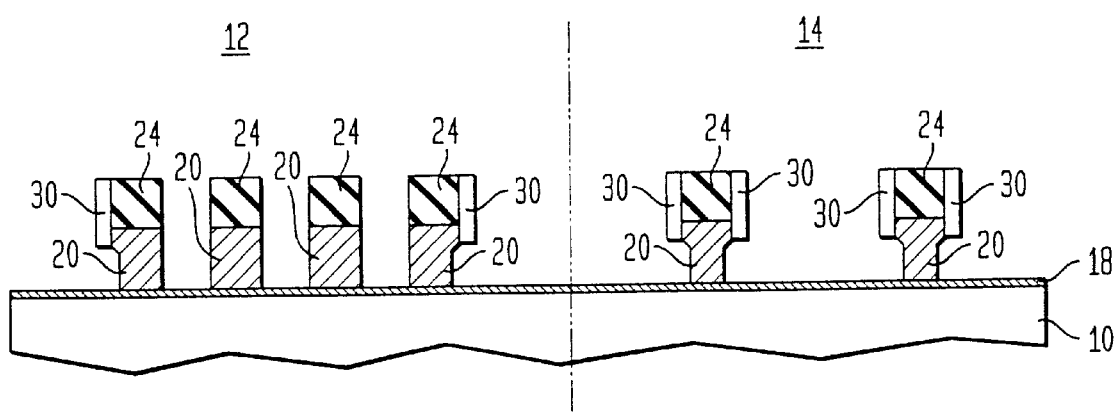

FIG. 8 shows the structure that is obtained after the gapfill film has been removed from between the adjacent protective gate stacks in the array device region. In accordance with the present invention, this processing step is carried using an isotropic etching process such as an HF-containing etchant which is selective to the remaining gate conductor. The remaining exposed portions of gate conductor 20 are removed by conventional anisotropic etching which is selective to gate dielectric 18, insulating cap 24, and spacer material.

FIG. 9 shows a completed CMOS IC structure which comprises support region notched gate 50, array region gates 52, source/drain diffusion regions 54 and diffusion contacts 56. The structure shown in FIG. 9 is formed utilizing conventional CMOS processing steps that are well known to those skilled in the art. For example, the diffusion contacts, which are composed of a conventional conductive metal, e.g., Cu or W, are formed by deposition, lithography and etching. The source/drain regions are formed by conventional ion implantation process and they are activated by conventional activation annealing processes By not removing insulating cap 24 from predetermined gate conductors, borderless contacts to source/drain diffusions may be formed on a selective basis (i.e., in the memory array and as needed elsewhere on the chip).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described herein, but fall within the scope of the appended claims.

Having thus described our invention in detail, what we claim is new and desire to secure by the Letters Patent is:

1. A complementary metal oxide semiconductor integrated circuit (CMOS IC) comprising:

a substrate having source and drain diffusion regions formed therein, and comprising array device regions and support device regions;

notched gates having unfilled undercut regions formed in said support device regions on portions of said substrate that do not include said source and drain diffusion regions; and gates formed in said array device regions on portions of said substrate that do not include said source and drain diffusion regions, said gates in said support device regions including an insulating cap self-aligned with a gate conductor, wherein some of said source and drain diffusion regions in said support and array device regions contain borderless diffusion contacts.

2. The CMOS IC of claim 1 wherein said substrate is composed of a semiconducting material selected from the group consisting of Si, Ge, SiGe, InAs, GaAs, InP, Si/Si, Si/SiGe and silicon-on-insulators (SOIs).

3. The CMOS IC of claim 1 wherein said notched gates comprise a gate conductor.

4. The CMOS IC of claim 3 wherein said gate conductor is composed of polysilicon, a conductive metal or polysilicon and a silicide capping layer.

5. The CMOS IC of claim 1 wherein said insulating cap comprises SiN or an antireflective coating.

6. The CMOS IC of claim 1 wherein said gate conductor is composed of polysilicon, a conductive metal or polysilicon and a silicide capping layer.

7. The CMOS IC of claim 1 wherein said notched gates in said support regions have channel lengths that is shorter than channel lengths of the array gate.

* * * * *